United States Patent
Zou

(10) Patent No.: US 10,367,454 B2
(45) Date of Patent: Jul. 30, 2019

(54) TRANS-IMPEDANCE AMPLIFIER

(71) Applicant: Hangzhou Hongxin Microelectronics Technology Co., Ltd., Hangzhou (CN)

(72) Inventor: Hehong Zou, Hangzhou (CN)

(73) Assignee: HANGZHOU HONGXIN MICROELECTRONICS TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 15/844,607

(22) Filed: Dec. 17, 2017

(65) Prior Publication Data

US 2019/0036489 A1   Jan. 31, 2019

(30) Foreign Application Priority Data

Jul. 25, 2017 (CN) .......................... 2017 1 0612170

(51) Int. Cl.
| | |
|---|---|
| *H03F 3/08* | (2006.01) |
| *H03F 1/26* | (2006.01) |
| *H03F 3/45* | (2006.01) |
| *H03G 3/30* | (2006.01) |

(52) U.S. Cl.
CPC ............... *H03F 1/26* (2013.01); *H03F 3/082* (2013.01); *H03F 3/45475* (2013.01); *H03G 3/3084* (2013.01)

(58) Field of Classification Search
CPC ....................................................... H03F 3/08
USPC ..................................... 330/308; 250/214 A
See application file for complete search history.

(56) References Cited

U.S. PATENT DOCUMENTS

| | | | | |
|---|---|---|---|---|
| 8,509,629 | B2* | 8/2013 | Zou .................... | H03F 3/082 330/277 |
| 9,276,535 | B2* | 3/2016 | van Sinderen ........ | H03F 3/193 |
| 2008/0150600 | A1* | 6/2008 | Taylor ................ | H03K 5/156 327/175 |
| 2011/0018627 | A1* | 1/2011 | Sutardja ............... | H03F 1/08 330/100 |
| 2013/0135054 | A1* | 5/2013 | Ito ...................... | H03F 3/08 330/308 |
| 2015/0145597 | A1* | 5/2015 | Huang ............... | H03F 3/45071 330/260 |

* cited by examiner

*Primary Examiner* — Henry Choe
(74) *Attorney, Agent, or Firm* — Muncy, Geissler, Olds & Lowe, P.C.

(57) ABSTRACT

The present disclosure provides a trans-impedance amplifier, comprising: an inverting amplifier circuit, having an input end and an output end. The input end is coupled to an optical diode and is used for accessing an input voltage signal, and the output end is used for outputting an amplified voltage signal. The inverting amplifier circuit comprises at least three sequentially-connected amplifier units. Each of the amplifier units comprises two mutually-coupled N-type transistors, wherein one N-type transistor is used for receiving an input voltage, and the other N-type transistor is used for receiving a DC voltage signal. A common connection end of the two N-type transistors is used for outputting an amplified voltage signal, and the N-type transistor used for receiving the DC voltage signal adopts a native NFET. The trans-impedance amplifier further comprises a feedback resistor coupled to the input end and the output end of the inverting amplifier circuit.

6 Claims, 1 Drawing Sheet

TRANS-IMPEDANCE AMPLIFIER

CROSS-REFERENCE TO RELATED APPLICATIONS

This Non-provisional application claims priority under 35 U.S.C. § 119(a) on Patent Application No(s). 201710612170.9 filed in China on Jul. 25, 2017, the entire contents of which are hereby incorporated by reference.

BACKGROUND OF THE INVENTION

Field of the Invention

The present disclosure relates to the field of complementary metal oxide semiconductor (CMOS) technology and, more particularly, to a trans-impedance amplifier which expands gain, reduces noise and is simple in design.

Description of the Related Art

A trans-impedance amplifier (TIA) is one type of amplifiers. Types of amplifiers are defined according to types of input/output signal of the amplifiers. Having an advantage of high bandwidth, the TIA generally is used in high speed circuits. For example, the TIA is widely used in photoelectric transmission communication systems.

Magnitude of output noise of a trans-impedance amplifier is one of important indicators of measuring its transmission performance. Therefore, it is necessary to reduce noise output to improve the performance of the trans-impedance amplifier, and one of manners of reducing the noise output may be implemented by increasing transimpedance. Theoretically, the greater the transimpedance is, the smaller the noise is. However, the transconductance is restricted by conditions. A prerequisite of increasing the transconductance is presence of a good frequency response, and whether the frequency response is good or not may be embodied from a gain-bandwidth product. To provide stable voltage operating points, existing trans-impedance amplifiers adopt a manner of combining positive channel metal oxide semiconductor (PMOS) and Negative channel metal oxide semiconductor (NMOS) to implement the above effects. However, due to limitations of working characteristics of the PMOS, $f_{Tdouble}$ of the trans-impedance amplifiers is smaller, which to some extent causes the gain-bandwidth product to lessen, thereby making a value of the transconductance difficult to further largen, and the magnitude of output noise of the trans-impedance amplifiers difficult to be further reduced.

BRIEF SUMMARY OF THE INVENTION

The present disclosure provides a trans-impedance amplifier to solve the above problems.

To solve the above problems, an embodiment of the present disclosure provides a trans-impedance amplifier, including:

an inverting amplifier circuit, having an input end and an output end, the input end being coupled to an optical diode and used for accessing an input voltage signal, the output end being used for outputting an amplified voltage signal, the inverting amplifier circuit comprising at least three sequentially-connected amplifier units, each of the amplifier units comprising two mutually-coupled N-type transistors, one N-type transistor being used for receiving an input voltage, the other N-type transistor being used for receiving a DC voltage signal, a common connection end of the two N-type transistors being used for outputting an amplified voltage signal, wherein the N-type transistor used for receiving a DC voltage signal adopts a native n-channel metal-oxide-semiconductor field-effect transistor (NFET); and a feedback resistor, coupled to the input end and the output end of the inverting amplifier circuit.

As an embodiment, the inverting amplifier circuit may include three amplifier circuits, namely:

a primary amplifier unit, which may have an input end and an output end, the input end may be coupled to an optical diode and used for accessing an input voltage signal, the output end may be used for outputting a primarily amplified first voltage signal;

a secondary amplifier unit, which may have an input end and an output end, the input end may be coupled to the output end of the primary amplifier unit and used for accessing a first voltage, the output end may be used for outputting a secondarily amplified second voltage signal; and a tertiary amplifier unit, which may have an input end and an output end, the input end may be coupled to the output end of the secondary amplifier unit and used for accessing a second voltage, and the output end may be used for outputting a tertiarily amplified voltage signal.

As an embodiment, the primary amplifier unit may include:

a first N-type transistor, a second end thereof may be coupled to an output end of the optical diode and used for receiving the input voltage signal, a first end thereof may be used for outputting the first voltage signal, and a third end thereof may be grounded; and a second N-type transistor, both a first end and a second end thereof may be used for receiving the DC voltage signal, and a third end thereof may be coupled to the first end of the first N-type transistor.

As an embodiment, the secondary amplifier unit may include:

a third N-type transistor, a second end thereof may be coupled to the output end of the primary amplifier unit and used for receiving the first voltage V1, a first end thereof may be used for outputting the second voltage signal, and a third end thereof may be grounded; and a fourth N-type transistor, both a first end and a second end thereof may be used for receiving the DC voltage signal, and a third end thereof may be coupled to the first end of the third N-type transistor.

As an embodiment, the tertiary amplifier unit may include:

a fifth N-type transistor, a second end thereof may be coupled to the output end of the secondary amplifier unit 102 and used for receiving the second voltage V2, a first end thereof may be used for outputting the amplified voltage signal, and a third end thereof may be grounded; and a sixth N-type transistor, both a first end and a second end thereof may be used for receiving the DC voltage signal, and a third end thereof may be coupled to the first end of the fifth N-type transistor.

As an embodiment, the amplifier unit may further include a resistor, wherein an end of the resistor may be used for receiving the DC voltage signal, and another end thereof may be coupled to the second end of the N-type transistor used for receiving the DC voltage signal.

As an embodiment, an N-type transistor may be further arranged between the input end and the output end of the amplifier unit.

As an embodiment, two ends of the feedback resistor may be provided with an N-type transistor.

Compared with the prior art, beneficial effects of the present disclosure are as below: a gain-bandwidth product of an operational amplifier composed of two N-type transistors may be increased. Therefore, when the same fixed bandwidth is given, the gain-bandwidth product of the trans-impedance amplifier of the present disclosure is much higher than that of a trans-impedance amplifier in the prior art. Thus, the feedback resistor of the trans-impedance amplifier may be not restricted by original conditions, and may be designed to be a resistor having a high resistance value, so that the input noise of the trans-impedance amplifier is further reduced, and the sensitivity of the trans-impedance amplifier is enhanced.

Figure 1:
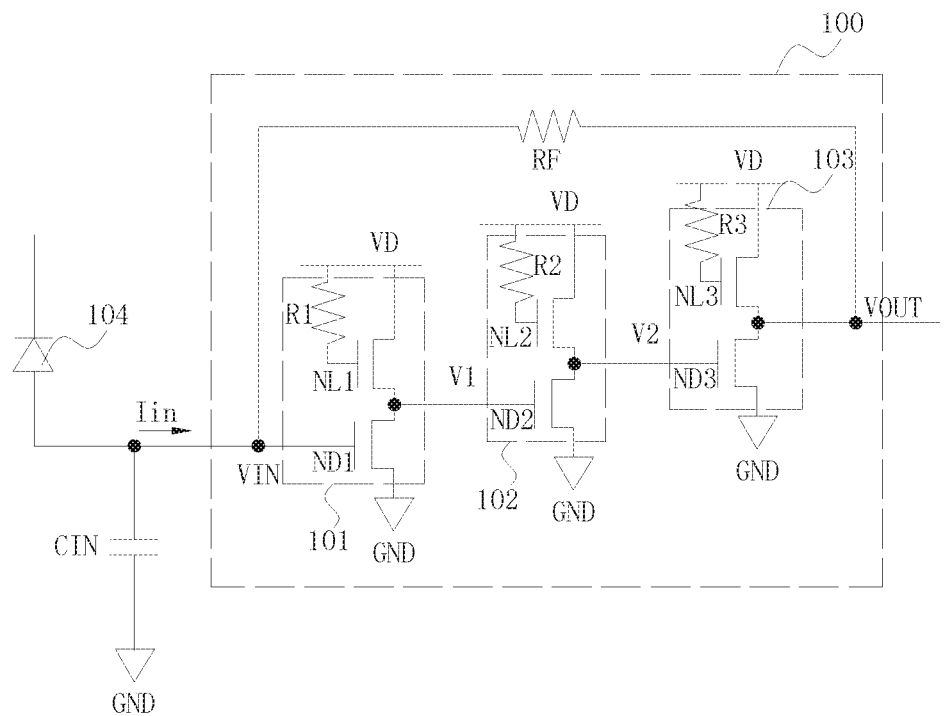
FIG. 1 is a schematic diagram of a trans-impedance amplifier according to the present disclosure.

Reference numerals: trans-impedance amplifier 100; primary amplifier unit 101; secondary amplifier unit 102; tertiary amplifier unit 103; and optical diode 104.

DETAILED DESCRIPTION OF THE INVENTION

The foregoing and additional technical features and advantages of the present disclosure are described clearly and completely below, in conjunction with the accompanying drawings. Apparently, the described embodiments are some but not all of the embodiments of the present disclosure.

As shown in FIG. 1, the trans-impedance amplifier 100 includes an inverting amplifier circuit and a feedback resistor RF which is coupled to the input end and the output end of the inverting amplifier circuit. The input end of the inverting amplifier circuit is coupled to the optical diode 104 and is used for accessing an input voltage signal, and the output end is used for outputting an amplified voltage signal. The inverting amplifier circuit includes at least three amplifier units. Each of the amplifier units includes two mutually-coupled N-type transistors, wherein one N-type transistor is used for receiving an input voltage, and the other N-type transistor is used for receiving a DC voltage signal. A common connection end of the two N-type transistors is used for outputting an amplified voltage signal, wherein the N-type transistor used for receiving the DC voltage signal adopts a native NFET. In this embodiment, the number of the amplifier units is three, namely, the primary amplifier unit 101, the secondary amplifier unit 102 and the tertiary amplifier unit 103. Positions of the three amplifier unit are not explicitly requested, and may be interchanged as required.

The primary amplifier unit 101 has an input end and an output end. The input end is coupled to the optical diode 104 and is used for accessing an input voltage VIN, and the output end is used for outputting a primarily amplified first voltage signal V1. The secondary amplifier unit 102 has an input end and an output end. The input end is coupled to the output end of the primary amplifier unit 101 and is used for accessing the first voltage signal V1, and the output end is used for outputting a secondarily amplified second voltage signal V2. The tertiary amplifier unit 103 has an input end and an output end. The input end is coupled to the output end of the secondary amplifier unit 102 and is used for accessing the second voltage signal V2, and the output end is used for outputting a tertiarily amplified voltage signal VOUT. The feedback resistor RF is coupled to the input end of the primary amplifier unit 101 and the output end of the tertiary amplifier unit 103.

The three amplifier units are similar in structure. The primary amplifier unit 101 includes a first N-type transistor ND1 and a second N-type transistor NL1. A second end of the first N-type transistor ND1 is coupled to an output end of the optical diode 104 and is used for receiving the input voltage signal VIN. A first end of the first N-type transistor ND1 is used for outputting the first voltage signal V1, and a third end of the first N-type transistor ND1 is grounded. Both a first end and a second end of the second N-type transistor NL1 are used for receiving the DC voltage signal VD, and a third end thereof is coupled to the first end of the first N-type transistor ND1. The secondary amplifier unit 102 includes a third N-type transistor ND2 and a fourth N-type transistor NL2. A second end of the third N-type transistor ND2 is coupled to the output end of the primary amplifier unit 101 and is used for receiving the first voltage signal V1, a first end thereof is used for outputting the second voltage V2, and a third end thereof is grounded. Both a first end and a second end of the fourth N-type transistor NL2 are used for receiving the DC voltage signal VD, and a third end thereof is coupled to the first end of the third N-type transistor ND2. The tertiary amplifier unit 103 includes a fifth N-type transistor ND3 and a sixth N-type transistor NL3. A second end of the fifth N-type transistor ND3 is coupled to the output end of the secondary amplifier unit 102 and is used for receiving the second voltage V2, a first end thereof is used for outputting the amplified voltage signal VOUT, and a third end thereof is grounded. Both a first end and a second end of the sixth N-type transistor NL3 are used for receiving the DC voltage signal VD, and a third end thereof is coupled to the first end of the fifth N-type transistor ND3. The second N-type transistor NL1, the fourth N-type transistor NL2 and the sixth N-type transistor NL3 adopt a native NFET.

The primary amplifier unit 101, the secondary amplifier unit 102, the tertiary amplifier unit 103 and the feedback resistor RF of the trans-impedance amplifier 100 form a three-stage operational amplifier. All the three amplifier units adopt structures of two N-type transistors to implement a primary inverting amplification. Gains are increased to the utmost extent using a connection structure of the two N-type transistors, and no negative effect is exerted on bandwidth. Therefore, a gain-bandwidth product of the trans-impedance amplifier 100 may be increased to a great extent. The gain of the primary amplifier unit is $$Av = \frac{g_{mND1}}{g_{mNL1}},$$

the gain of the secondary amplifier unit is $$Av = \frac{g_{mND2}}{g_{mNL2}},$$

and the gain of the tertiary amplifier unit is $$Av = \frac{g_{mND3}}{g_{mNL3}}.$$

Therefore, the gain of the trans-impedance amplifier 100 is $$Av = \frac{g_{mND1}}{g_{mNL1}} \times \frac{g_{mND2}}{g_{mNL1}} \times \frac{g_{mND3}}{g_{mNL3}},$$

and in the above formula, $g_{mNi}$ represents a conductance of an N-type transistor, wherein i∈{D1,D2,D3,L1,L2,L3}.

The gain-bandwidth product of an operational amplifier using N-type transistors may be increased. Therefore, when the same fixed bandwidth is given, the gain-bandwidth product of the trans-impedance amplifier of the present disclosure is much higher than that of a trans-impedance amplifier in the prior art. Thus, the feedback resistor RF of the trans-impedance amplifier 100 may be not restricted by original conditions, and may be designed to be a resistor having a high resistance value, so that the input noise of the trans-impedance amplifier is further reduced, and the sensitivity of the trans-impedance amplifier 100 is enhanced.

Figure 2:
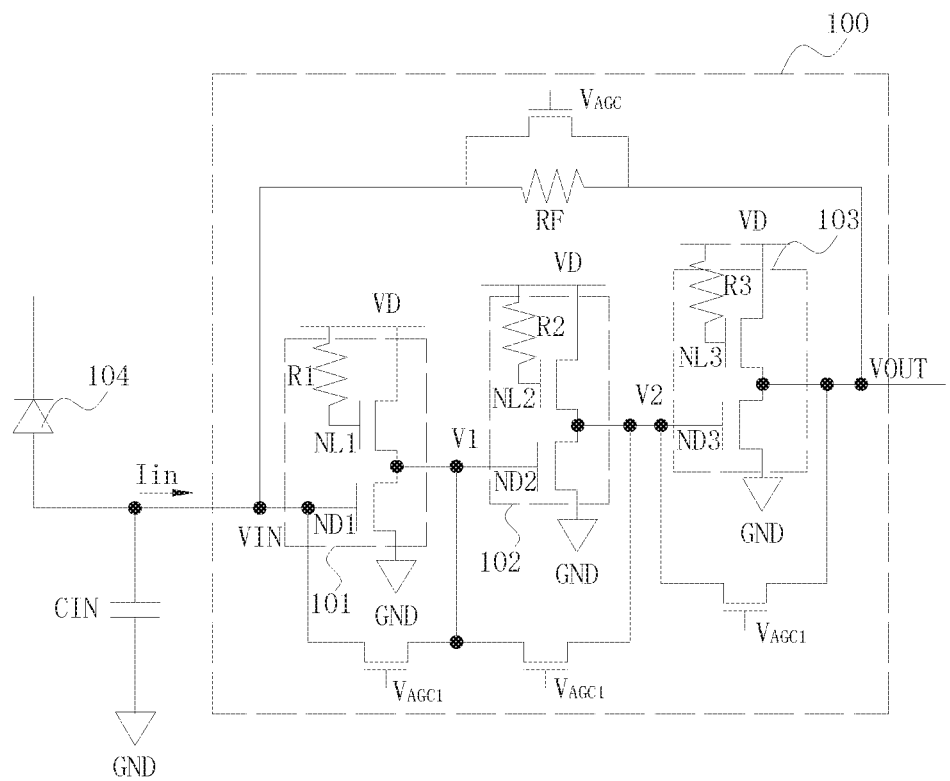
FIG. 2 is a schematic diagram of a trans-impedance amplifier according to another embodiment of the present disclosure.

As shown in FIG. 2, as another embodiment of the present disclosure, a resistor may be arranged for the three amplifier units as required. An end of the resistor receives a DC voltage, and another end thereof is coupled to the second end of the N-type transistor used for receiving the DC voltage signal. A resistor is coupled to the second end of the N-type transistor, so that the resistor may serve as an active inductor. The bandwidth of the amplifier units may be increased, so that the gain-bandwidth product of the whole trans-impedance amplifier 100 is increased.

As shown in FIG. 2, as another embodiment of the present disclosure, each of the three amplifier units may be provided with an N-type transistor between the input end and the output end thereof, and an N-type transistor is also provided between two ends of the feedback resistor. This N-type transistor may implement automatic gain control (AGC) of the trans-impedance amplifier.

In addition to the above functions, the conductance of the N-type transistor in the trans-impedance amplifier 100 may be reduced when noise and sensitivity are not major design objectives of the trans-impedance amplifier 100. Current consumption may be reduced when the conductance is reduced, and thus power consumption reduction of the trans-impedance amplifier 100 is implemented.

In the above specific embodiments, the objectives, the technical solutions and the beneficial effects of the present disclosure are further described in detail. However, it should be understood that the above embodiments are merely specific embodiments of the present disclosure and are not intended to limit the scope of protection of the present disclosure. It is particularly pointed out that for those skilled in the art, all modifications, equivalent substitutions and improvements made within the spirit and principle of the present disclosure shall fall within the scope of protection of the present disclosure.

What is claimed is:

1. A trans-impedance amplifier, comprising:
an inverting amplifier circuit, having an input end and an output end, the input end being coupled to an optical diode and used for accessing an input voltage signal, the output end being used for outputting an amplified voltage signal, the inverting amplifier circuit comprising at least three sequentially-connected amplifier units, each of the amplifier units comprising two mutually-coupled N-type transistors, one N-type transistor being used for receiving an input voltage, the other N-type transistor being used for receiving a DC voltage signal, a common connection end of the two N-type transistors being used for outputting an amplified voltage signal, wherein the N-type transistor used for receiving a DC voltage signal adopts a native NFET, wherein the inverting amplifier circuit comprises:
   a primary amplifier unit having an input end and an output end, the input end being coupled to an optical diode and used for accessing an input voltage signal, the output end being used for outputting a primarily amplified first voltage signal, wherein the primary amplifier unit comprises:
      a first N-type transistor, a second end thereof being coupled to an output end of the optical diode and used for receiving the input voltage signal, a first end thereof being used for outputting the first voltage signal, and a third end thereof being grounded; and
      a second N-type transistor, both a first end and a second end thereof being used for receiving the DC voltage signal, and a third end thereof being coupled to the first end of the first N-type transistor;
   a secondary amplifier unit, having an input end and an output end, the input end being coupled to the output end of the primary amplifier unit and used for accessing a first voltage, the output end being used for outputting a secondarily amplified second voltage signal; and
   a tertiary amplifier unit, having an input end and an output end, the input end being coupled to the output end of the secondary amplifier unit and used for accessing a second voltage, and the output end being used for outputting a tertiarily amplified voltage signal; and
a feedback resistor, coupled to the input end and the output end of the inverting amplifier circuit.

2. A trans-impedance amplifier, comprising:
an inverting amplifier circuit, having an input end and an output end, the input end being coupled to an optical diode and used for accessing an input voltage signal, the output end being used for outputting an amplified voltage signal, the inverting amplifier circuit comprising at least three sequentially-connected amplifier units, each of the amplifier units comprising two mutually-coupled N-type transistors, one N-type transistor being used for receiving an input voltage, the other N-type transistor being used for receiving a DC voltage signal, a common connection end of the two N-type transistors being used for outputting an amplified voltage signal, wherein the N-type transistor used for receiving a DC voltage signal adopts a native NFET, wherein the inverting amplifier circuit comprises:
   a primary amplifier unit, having an input end and an output end, the input end being coupled to an optical diode and used for accessing an input voltage signal, the output end being used for outputting a primarily amplified first voltage signal;
   a secondary amplifier unit, having an input end and an output end, the input end being coupled to the output end of the primary amplifier unit and used for accessing a first voltage, the output end being used for outputting a secondarily amplified second voltage signal, wherein the secondary amplifier unit comprises:
- a first N-type transistor, a second end thereof being coupled to the output end of the primary amplifier unit and used for receiving the first voltage, a first end thereof being used for outputting the second voltage signal, and a third end thereof being grounded; and
- a second N-type transistor, both a first end and a second end thereof being used for receiving the DC voltage signal, and a third end thereof being coupled to the first end of the third N-type transistor; and a tertiary amplifier unit, having an input end and an output end, the input end being coupled to the output end of the secondary amplifier unit and used for accessing a second voltage, and the output end being used for outputting a tertiarily amplified voltage signal; and a feedback resistor, coupled to the input end and the output end of the inverting amplifier circuit.

3. A trans-impedance amplifier, comprising:

an inverting amplifier circuit, having an input end and an output end, the input end being coupled to an optical diode and used for accessing an input voltage signal, the output end being used for outputting an amplified voltage signal, the inverting amplifier circuit comprising at least three sequentially-connected amplifier units, each of the amplifier units comprising two mutually-coupled N-type transistors, one N-type transistor being used for receiving an input voltage, the other N-type transistor being used for receiving a DC voltage signal, a common connection end of the two N-type transistors being used for outputting an amplified voltage signal, wherein the N-type transistor used for receiving a DC voltage signal adopts a native NFET, wherein the inverting amplifier circuit comprises:

a primary amplifier unit, having an input end and an output end, the input end being coupled to an optical diode and used for accessing an input voltage signal, the output end being used for outputting a primarily amplified first voltage signal;

a secondary amplifier unit, having an input end and an output end, the input end being coupled to the output end of the primary amplifier unit and used for accessing a first voltage, the output end being used for outputting a secondarily amplified second voltage signal; and a tertiary amplifier unit, having an input end and an output end, the input end being coupled to the output end of the secondary amplifier unit and used for accessing a second voltage, and the output end being used for outputting a tertiarily amplified voltage signal, wherein the tertiary amplifier unit comprises:
- a first N-type transistor, a second end thereof being coupled to the output end of the secondary amplifier unit and used for receiving the second voltage V2, a first end thereof being used for outputting the amplified voltage signal, and a third end thereof being grounded; and
- a second N-type transistor, both a first end and a second end thereof being used for receiving the DC voltage signal, and a third end thereof being coupled to the first end of the fifth N-type transistor; and a feedback resistor, coupled to the input end and the output end of the inverting amplifier circuit.

4. The trans-impedance amplifier according to claim 1, wherein the amplifier unit further comprises a resistor, an end of the resistor being used for receiving the DC voltage signal, and another end thereof being coupled to a second end of an N-type transistor used for receiving the DC voltage signal.

5. The trans-impedance amplifier according to claim 1, wherein an N-type transistor is further arranged between the input end and the output end of the amplifier unit.

6. The trans-impedance amplifier according to claim 1, wherein two ends of the feedback resistor are provided with an N-type transistor.

* * * * *